(12) United States Patent
Madland

(10) Patent No.: US 6,377,078 B1
(45) Date of Patent: Apr. 23, 2002

(54) CIRCUIT TO REDUCE CHARGE SHARING FOR DOMINO CIRCUITS WITH PULSED CLOCKS

(75) Inventor: Paul D. Madland, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,940

(22) Filed: Dec. 30, 1999

(51) Int. Cl.[7] .............................................. H03K 19/096
(52) U.S. Cl. ............................... 326/95; 326/98; 326/93
(58) Field of Search ........................... 326/95–98, 104, 326/106, 108, 112, 119, 121

(56) References Cited

U.S. PATENT DOCUMENTS

| 5,642,061 | A | * | 6/1997 | Gorny | 326/97 |
|---|---|---|---|---|---|
| 5,764,089 | A | * | 6/1998 | Partovi et al. | 327/200 |
| 5,828,234 | A | * | 10/1998 | Sprague | 326/98 |
| 5,838,169 | A | * | 11/1998 | Schorn | 326/98 |
| 5,880,608 | A | * | 3/1999 | Mehta et al. | 326/93 |
| 6,046,606 | A | * | 4/2000 | Chu et al. | 326/95 |
| 6,052,008 | A | * | 4/2000 | Chu et al. | 327/200 |
| 6,060,910 | A | * | 5/2000 | Inui | 326/98 |
| 6,111,434 | A | * | 8/2000 | Ciraula et al. | 326/98 |

OTHER PUBLICATIONS

Patra, P.; Narayanan, U. Automated phase assignment for the synthesis of low power domino circuits. pp. 379–384, Jun. 1999.*

* cited by examiner

*Primary Examiner*—Michael Tokar
*Assistant Examiner*—Vibol Tan
(74) *Attorney, Agent, or Firm*—Blakely, Sokoloff, Taylor & Zafman LLP

(57) ABSTRACT

A circuit includes at least one input, an evaluate pulsed clock, and an output. In one embodiment, the circuit precharges an intermediate node in the circuit in response to a precharge pulsed clock and the evaluate pulsed clock.

46 Claims, 10 Drawing Sheets ns of various embodiments of the invention,
CIRCUIT TO REDUCE CHARGE SHARING FOR DOMINO CIRCUITS WITH PULSED CLOCKS

BACKGROUND OF THE INVENTION

1. Field of the Invention

The present invention relates to the field of integrated circuits and, more specifically, to logic circuits designed for high-speed operation, such as domino logic circuits.

2. Description of the Related Art

Performance goals of processors increase with every generation, and progressively more sophisticated architectures are required to implement their complex functions. Advanced architectures require long pipelines operating at very high frequencies. These higher frequencies demand increased usage of sophisticated circuit design styles like domino circuits.

Domino circuits increase the speed performance of logic circuits by reducing the capacitance associated with the use of P-type metal oxide semiconductors ("MOS"). Domino circuits accomplish this by precharging a series of logic gates during a first clock phase, or precharge cycle, and evaluating the intended logic function during the next clock phase, or evaluation cycle. However, domino circuits tend to be susceptible to the problem of charge sharing between internal nodes. Domino circuits using pulsed clocks do not lend themselves to the standard intermediate node precharge methods. Internal nodes provide connecting points internal to the circuit and they do not provide output signals. The occurrence of charge sharing in a domino circuit may cause device failure.

FIG. 1 represents a prior art domino circuit 150 which is typically susceptible to the problem of charge sharing. Domino circuit 150 contains a P-type transistor P1 170, which is used for precharge, and two N-type transistors N1 and N2 172, which perform a logic function. A third N-type transistor N3 174 is used to perform an evaluation function.

During the precharge cycle, a precharge pulsed clock ("Pclk") 160 transistions low and turns on transistor P1. When transistor P1 is on and evaluation pulsed clock ("Eclk") 166 is inactive, node A 180 is precharged. Node B stays low if input B 162 is low, which keeps transistor N1 off. However, if input B 162 changes its logic state from low to high after the precharge cycle, it turns on transistor N1. When transistor N1 is on, it connects node A 180 and node B 182. Consequently, the charge stored at node A 180 would have to be shared with node B 182 since the charge stored at node B is lower than the change at node A. The occurrence of a charge sharing between node A and node B typically causes output 156 to be undefined. Accordingly, an undefined output value may cause device failure.

Therefore, it is desirable to have a mechanism that prevents or reduces the occurrence of charge sharing in a domino circuit that uses a pulsed clock.

SUMMARY OF THE INVENTION

A circuit includes at least one input, an evaluate pulsed clock, and an output. In one embodiment, the circuit precharges an intermediate node in the circuit in response to a precharge pulsed clock and the evaluate pulsed clock.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

An apparatus and method for reducing charge sharing in domino circuits is disclosed.

In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

It is understood that the present invention may be comprised of transistor circuits that are readily manufacturable using well-known CMOS (complementary metal-oxide semiconductor) technology, or other equivalent semiconductor manufacturing processes. In addition, the present invention may be implemented with other manufacturing processes for making digital devices.

While the following discussion of the present invention is presented with respect to implementation in a microprocessor, the present invention is not limited to that implementation. Implementations for generating clock signals for various digital devices such as discrete logic devices, static devices, dynamic devices, memory devices, devices either on the same or separate chips, communications devices, etc., are within the scope of the present invention.

A mechanism is described that reduces, and possibly minimizes charge sharing between internal nodes in a domino circuit using pulsed clocks. A node is a connecting point where multiple wires or lines are connected to the connecting point. In one embodiment, intermediate nodes of a domino circuit are precharged to eliminate charge sharing among internal nodes. Intermediate nodes are defined as internal nodes of a circuit other than output nodes. In another embodiment, a domino circuit employs an intermediate node precharge circuit to precharge one or more intermediate nodes in response to an evaluate-pulsed clock.

Figure 2:
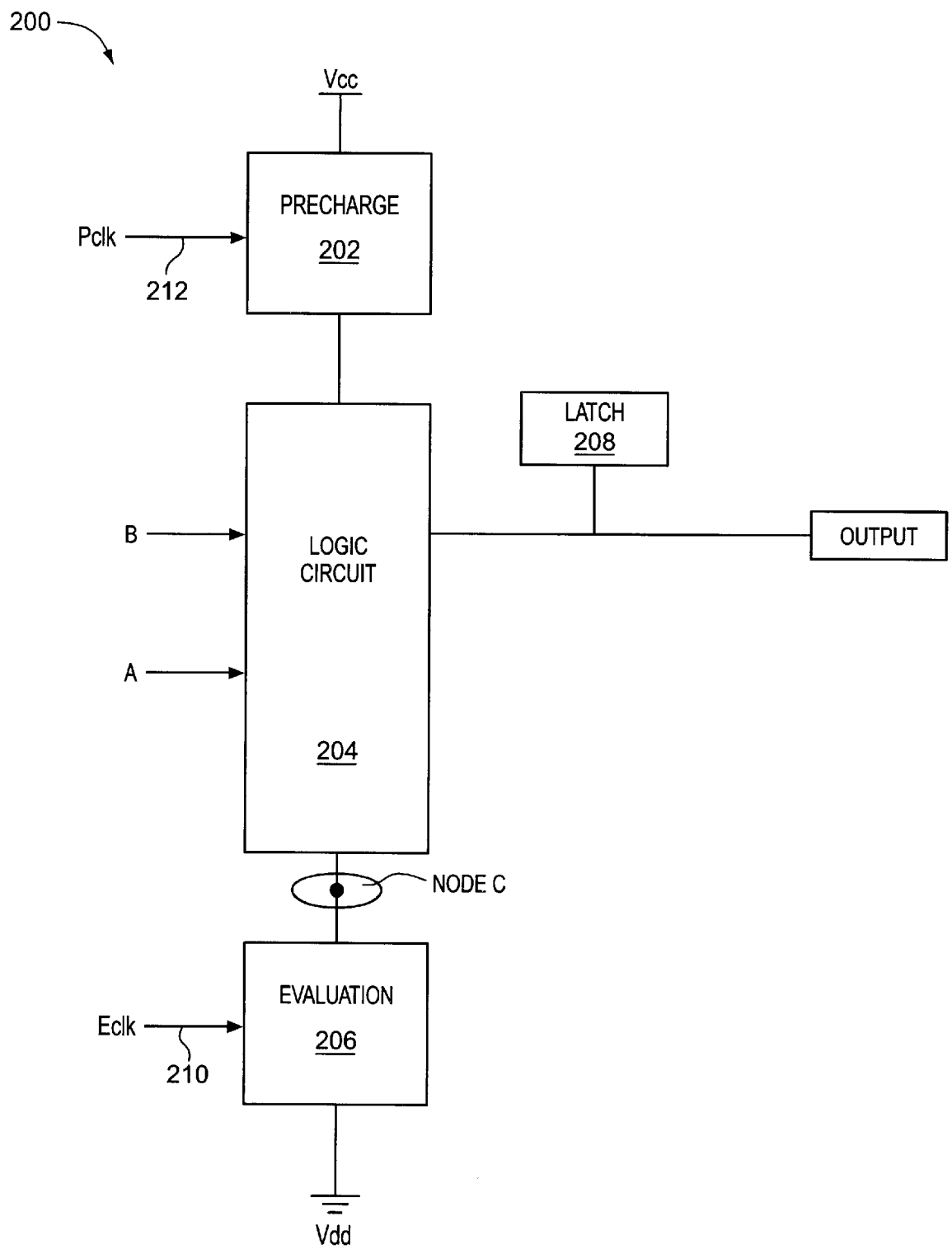
FIG. 2 is a block diagram of a circuit illustrating one embodiment of the domino circuit with a precharging intermediate node.

FIG. 2 is a block diagram of one embodiment of domino circuit 200. Referring to FIG. 2, domino circuit 200 includes a precharge circuit 202, a logic circuit 204, a latch 208, and an evaluation circuit 206. Precharge circuit 202 is coupled to logic circuit 204, a power supply Vcc, and a Pclk (precharge pulsed clock) 212. Pulsed clock signal 212 may be a discrete clock waveform as opposed to the traditional phased clock signal, which is a uniform clock waveform. It should be appreciated that pulsed clock signal 212 could be other types of clock waveforms, which will not affect the scope of the invention.

Precharge circuit 202 includes at least one transistor. Various PMOS (p-channel metal-oxide semiconductor) and/or NMOS (n-channel metal-oxide semiconductor) transistors may be used in precharge circuit 202. In one embodiment, precharge circuit 202 uses a PMOS transistor when Pclk 212 is negative enable. Negative enable refers to a device that operates or is on at logic state zero. It should be appreciated that precharge circuit 202 may receive additional control signals.

In operation, precharge circuit 202 charges predetermined nodes in logic circuit 204 to a predefined voltage level in response to the precharge cycle. The duration of the precharge cycle is controlled by Pclk 212. In one embodiment, precharge circuit 202 charges at least one intermediate node during the precharge cycle. It should be noted that a node is a connecting point where multiple wires can be coupled.

Still referring to FIG. 2, logic circuit 204 is coupled to latch 208, precharge circuit 202, and evaluation circuit 206. Latch 208 stores output information and precharge circuit 202 charges various internal nodes in logic circuit 204. In one embodiment, logic circuit 204 further receives at least input signals A and B and performs various two-input logic functions, such as a two-way AND or NAND gate function.

In operation, a logic function, such as AND, NAND, OR, NOR, Inversion, or exclusive OR gate, may be performed by logic circuit 204. Output nodes and intermediate nodes in logic circuit 204 as well as the intermediate node "Node C" may be precharged by precharge circuit 202 during each precharge cycle. Because of precharging intermediate nodes, charge sharing between the nodes is substantially reduced. Consequently, the precharging of internal nodes enhances not only the speed, but also the reliability of a domino circuit.

Evaluation circuit 206 is coupled to logic circuit 204 and a power supply Vdd. In one embodiment, Vdd, which is also known as Vss, is ground or low potential. An Eclk 210 (Evaluate-pulsed clock signal) is used to signal the duration of each evaluate cycle. For example, Eclk 210 is asserted for the entire period of evaluate cycle. Evaluation circuit 206 includes various PMOS and/or NMOS transistors to perform a function of evaluation. In one embodiment, an N-type transistor is used in evaluation circuit 206 when Eclk 210 is positive enable. A positive enable means a circuit that operates or is on at logic state high. It should be noted that evaluation circuit 206 may also receive other signals.

Figure 3A:
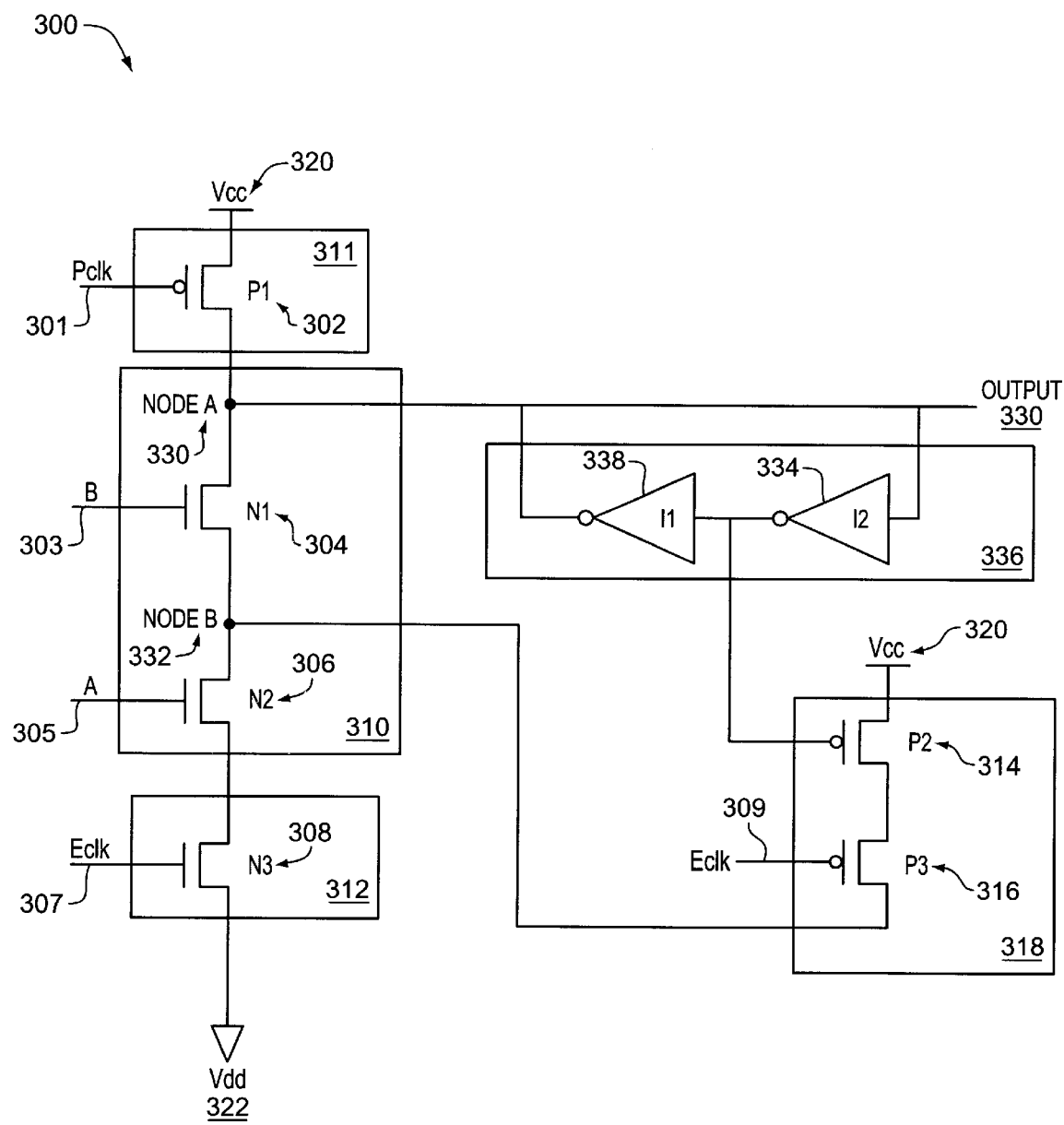
FIG. 3A is a NAND gate circuit illustrating one embodiment of a domino circuit with a precharging intermediate node.

FIG. 3A illustrates an embodiment of a NAND gate using a domino circuit 300. Referring to FIG. 3A, domino circuit 300 contains a precharge circuit 311, a logic circuit 310, an evaluation circuit 312, a latch 336, and an intermediate node precharge circuit 318. It should be appreciated that intermediate node precharge circuit 318 can be integrated in precharge circuit 311.

Precharge circuit 311 precharges output node A 330 during the precharge cycle. In one embodiment, a P-type transistor P1 may be used in precharge circuit 311 when Pclk 301 is negative enable. While the source of transistor P1 is coupled to a power supply Vcc 320, the gate of transistor P1 is coupled to Pclk 301. The drain of transistor P1 is coupled to node A 330 in logic circuit 310. The drain of transistor P1 is also the output of precharge circuit 311. In operation, when Pclk 301 goes low during the precharge cycle, it turns on transistor P1 and subsequently, node A 330 is precharged when a connection between Vcc 320 and node A 330 is established. Conversely, the precharging of node A 330 ends when Pclk 301 goes high, which turns off transistor P1 and shuts off the connection between Vcc 320 and node A 330.

Logic circuit 310 performs a logic function, such as a NAND gate or NOR gate or Inverter function. In one embodiment, logic circuit 310 contains two N-type transistors N1 and N2 where transistors N1 and N2 are connected in series to perform a NAND gate function. The drain of transistor N1 is coupled to node A 330, which is also the output of logic circuit 310. Node A 330 is further coupled to latch 336, which will be discussed later.

The gate of transistor N1 is coupled to input B 303 while the source of transistor N1 is coupled to node B 332. The drain of transistor N2 is also coupled to node B 332 while the gate of transistor N2 is coupled to input A 305. The source of transistor N2 is coupled to evaluation circuit 312. During the evaluation cycle, if both inputs A 305 and B 303 are high (logic is), node A 330 is pulled to Vdd 322 or ground and output 330 signals a logic zero. Conversely, if either input A 305 or input B 303 or both are low (logic zeros), node A 330 stays at Vcc 320 and consequently, output 330 signals a logic one.

Evaluation circuit 312 tells the logic device circuit 310 when to read output 330. In one embodiment, evaluation circuit 312 contains a transistor N3 where the gate of transistor N3 is coupled to Eclk 307. While the source of transistor N3 is coupled to Vdd 322 (or ground), the drain of transistor N3 is coupled to the source of transistor N2. In operation, when Eclk 307 goes high, it turns on transistor N3 where node A 330 transitions down to Vdd 322 if both input A 301 and input B 303 are high.

Latch 336 stores or maintains logic value at output 330. Two inverters I1 and I2 may be used in latch 336. Inverter I1 and inverter I2 are coupled in series and are used to maintain the logic value at output 330 between the precharge cycle and the evaluation cycle and between the evaluation cycle and the next precharge cycle. In one embodiment, the output of inverter I2 is coupled to intermediate node precharge circuit 318.

Intermediate node precharge circuit 318 precharges intermediate nodes to prevent charge sharing between node A 330 and node B 332. In one embodiment, intermediate node precharge circuit 318 contains two P-type transistors P2 and P3 where P2 and P3 are coupled in series. The source of transistor P2 is coupled to Vcc 320 and the drain of transistor P2 is coupled to the source of transistor P3. While the gate of transistor P2 is coupled to the output of inverter I2, the gate of transistor P3 is coupled to Eclk 309. The drain of transistor P3 is coupled to node B 332 of logic circuit 310.

In operation, upon node A 330 is precharged and Eclk 309 is inactive, intermediate node precharge circuit 318 precharges node B 332 when both transistor P2 and transistor P3 are turned on. Once both node A 330 and node B 332 are precharged, the charge sharing between node A 330 and node B 332 is substantially reduced when transistor N1 is subsequently turned on before the next precharge cycle. It should be appreciated that multiple intermediate node precharge circuit 318 may be used to precharge multiple intermediate nodes in a circuit including the intermediate node "node C".

Figure 3B:
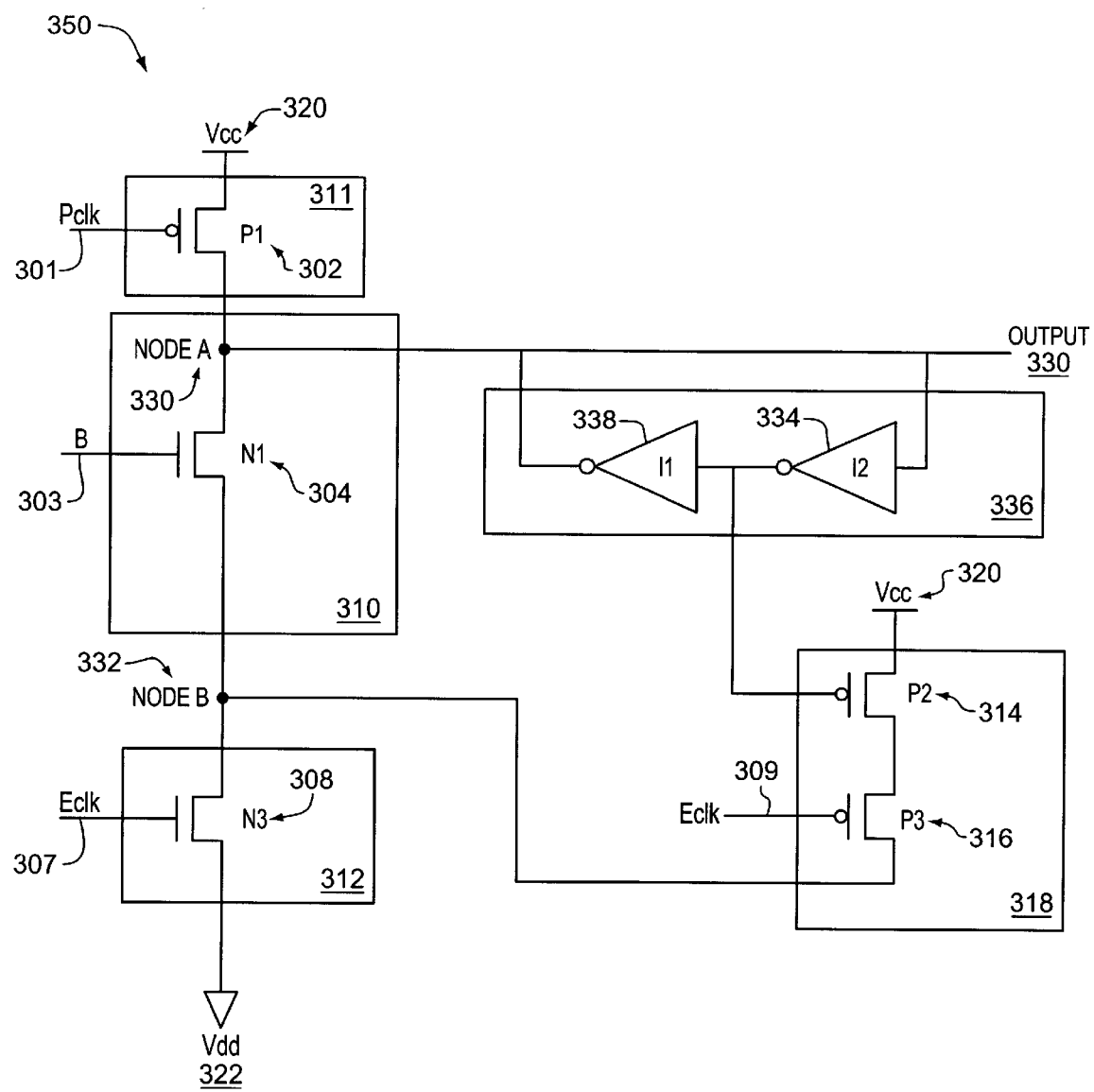
FIG. 3B is an inverter circuit illustrating one embodiment of a domino circuit with a precharging intermediate node.

FIG. 3B illustrates an embodiment of an inverter using a domino circuit 350. Domino circuit 350 contains essentially the same components as domino circuit 300 except N2 306 shown in FIG. 3A, which has been removed. In one embodiment, domino circuit 350 performs an inverting logic function using a pulsed clock.

Figure 4:
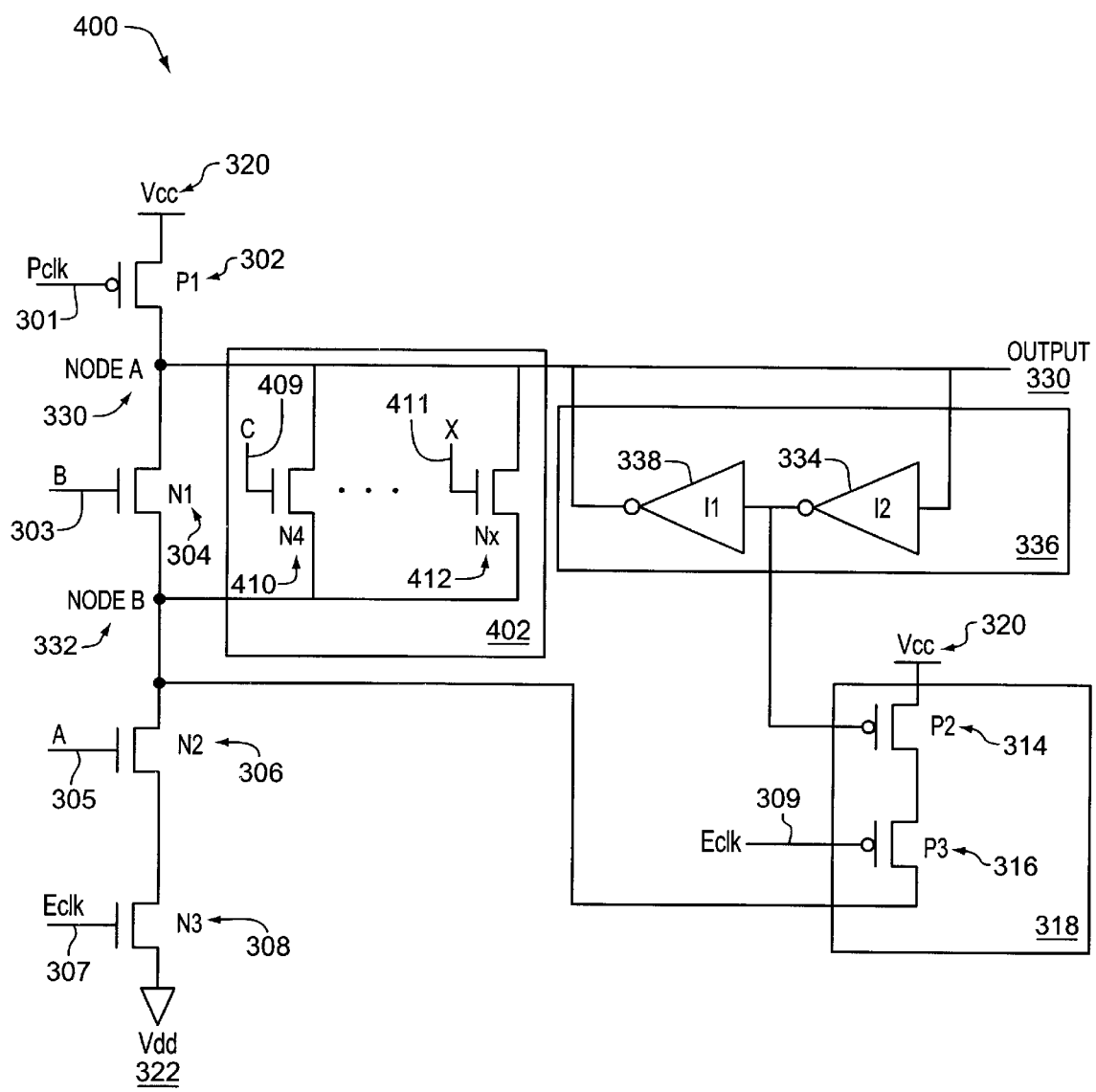
FIG. 4 is a combination logic circuit of one embodiment of a domino circuit with multiple inputs.

FIG. 4 illustrates an embodiment of a combination domino circuit 400 with more than two inputs. In one embodiment, combination domino circuit 400 is essentially the same domino circuit 300, which is illustrated in FIG. 3, with an additional circuit block 402. Circuit block 402 contains multiple transistors such as N4, where each transistor is gated by an input signal. For example, the gate of transistor N4 is coupled to input C 409 while the gate of transistor Nx is coupled to input X 411. Referring to FIG. 4, precharge node B 332 is more important in this situation because a charge sharing between node A 330 and node B 332 could easily occur when any one of input B 303, C 409, . . . and X 411 goes low and the capacitance of node B 332 is likely to be large compared to node A causing more charge sharing.

Figure 1:
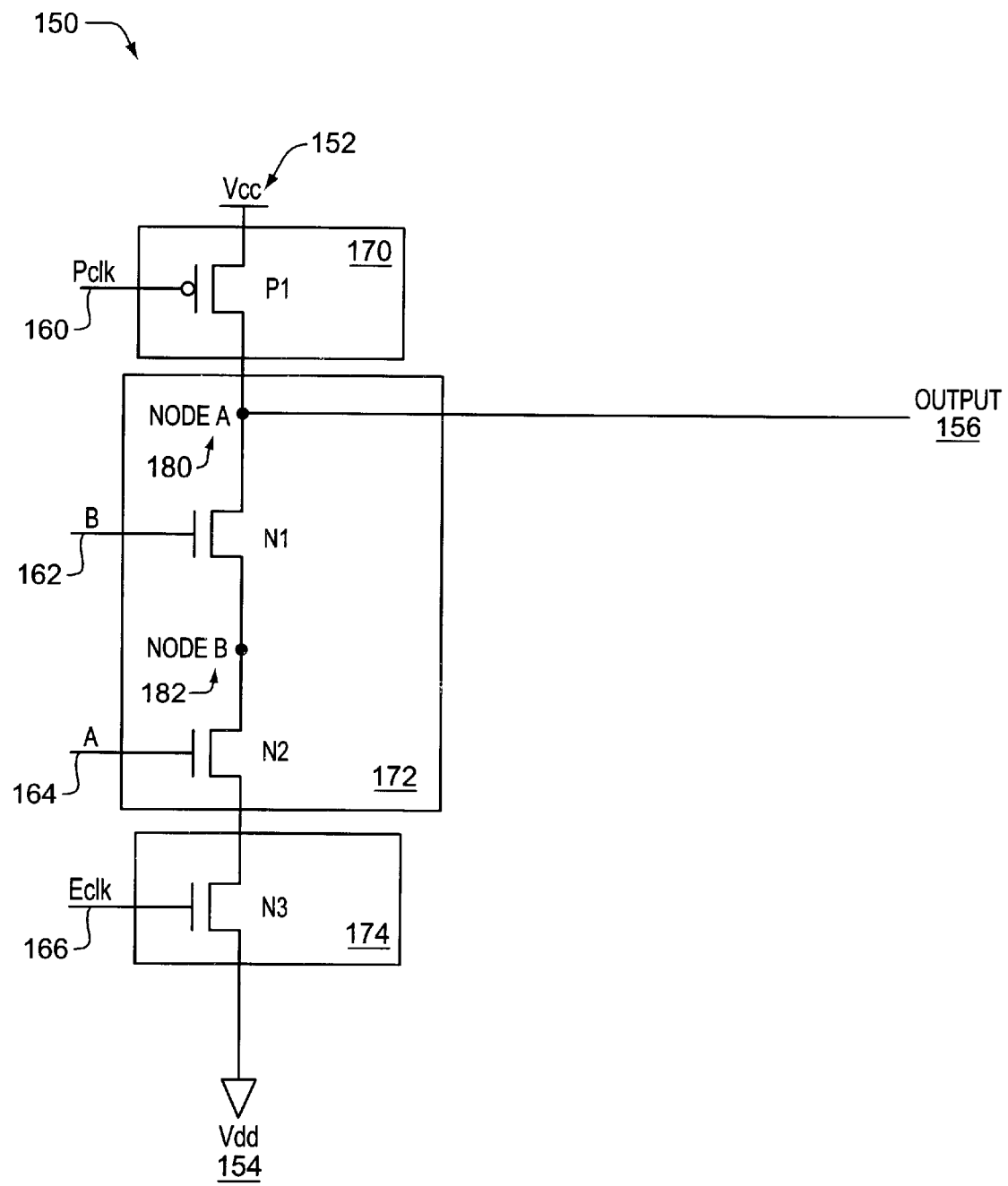
FIG. 1 is a circuit diagram illustrating a prior art domino circuit.
Figure 5:
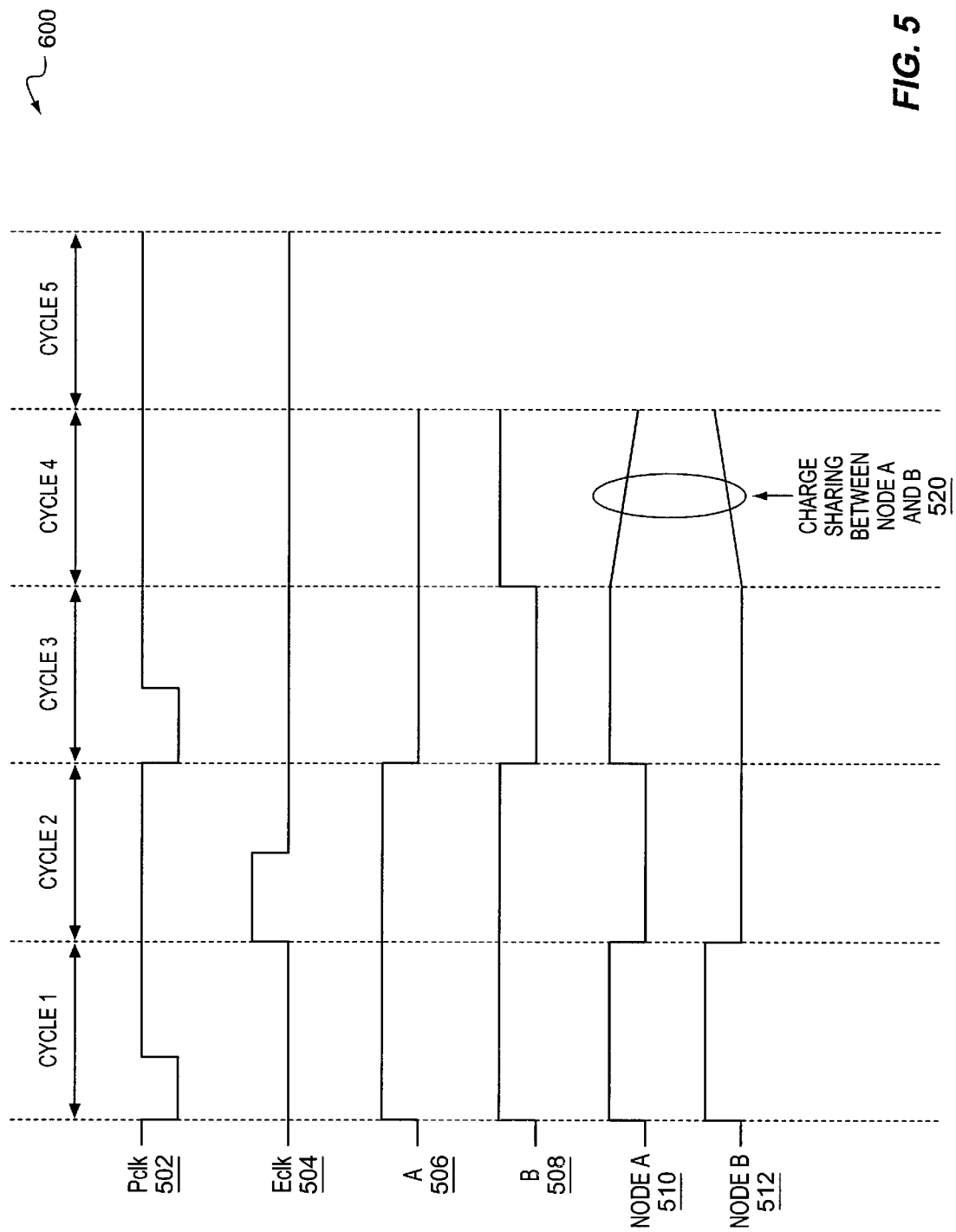
FIG. 5 is a timing diagram illustrating an occurrence of charge sharing within internal nodes when intermediate nodes are not precharged.

FIG. 5 is a NAND gate timing diagram 600 illustrating an occurrence of charge sharing when intermediate node precharge circuit is not used. Timing diagram 600 can be illustrated together with FIG. 1, which shows a NAND gate without an intermediate node precharge circuit. During cycle 1, while Eclk 504 is inactive, Pclk 502 goes low to activate a precharge cycle. Both node A 510 and node B 512 are precharged since input A 506 and B 508 are high.

During cycle 2, while Pclk 502 is inactive, Eclk 504 goes high to activate an evaluate cycle. Both node A 506 and node B 508 are pulled to a low logic state because both input A 506 and B 508 are high. During cycle 3, while Eclk 504 is inactive and Pclk 502 is active, node A 510 is precharged. While node A 510 is precharged, node B 512 remains low because both input A 506 and B 508 are low.

During cycle 4, while both Pclk 502 and Eclk 504 are inactive, input B 508 starts to change its logic state from inactive to active. When input B 508 changes logic and turns on transistor N1, a charge sharing between node A 510 and node B 512 has occurred. Accordingly, the charge at Node A 510 starts to drift low while the charge at node B 512 climbs up. As discussed above, the occurrence of charge sharing may cause the output of the device to be undefined, which may subsequently cause the system to stall or fail.

Figure 6:
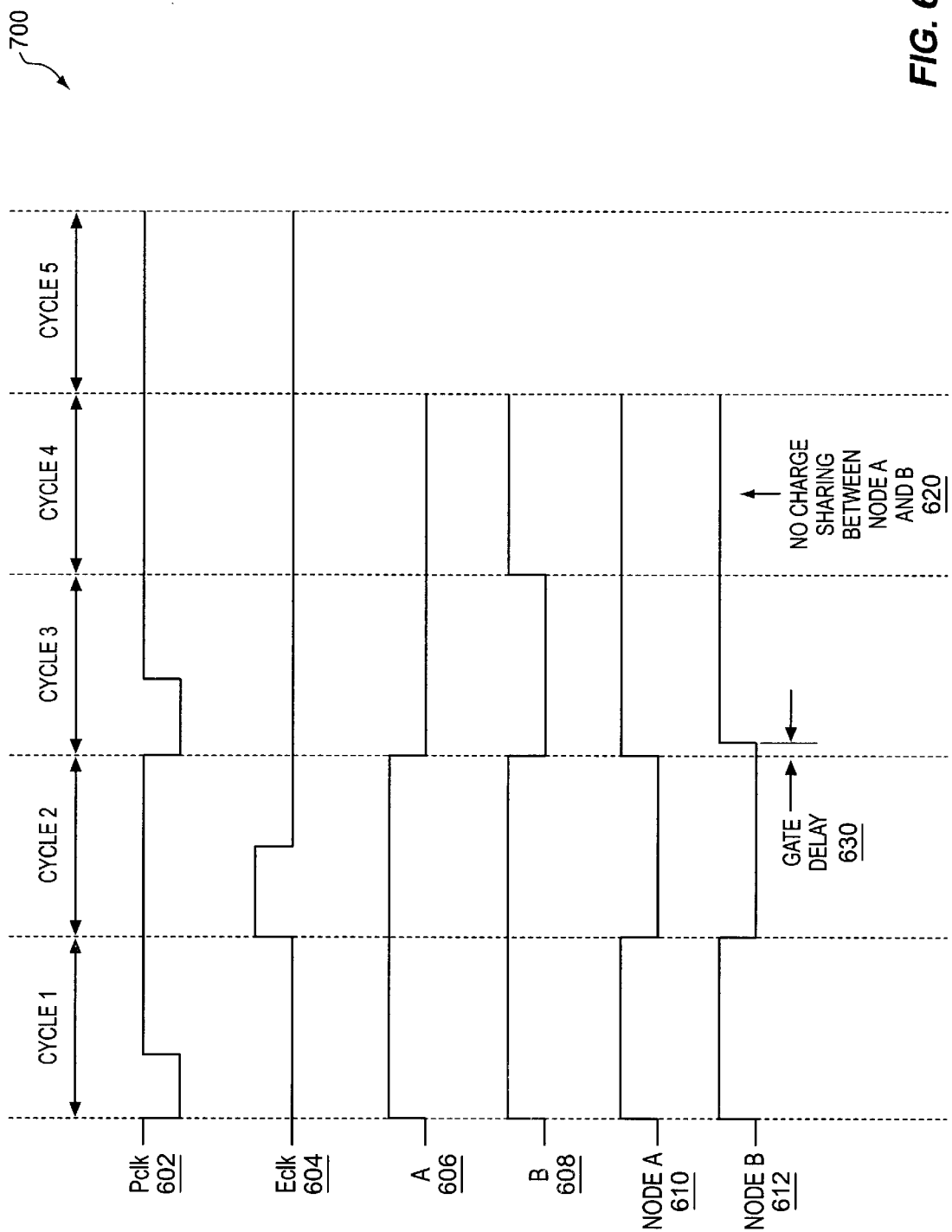
FIG. 6 is a timing diagram illustrating no occurrence of charge sharing when intermediate nodes are precharged.

FIG. 6 is an embodiment of a NAND gate timing diagram 700 where no charge sharing has occurred. It should be appreciated that timing diagram 700 could be illustrated together with FIG. 3, which shows a NAND gate domino circuit with an intermediate node precharge circuit.

During cycle 1, while Eclk 604 is inactive, Pclk 602 goes low to activate a precharge cycle. Both node A 610 and node B 612 are precharged since input A 606 and B 608 are high. During cycle 2, while Pclk 602 is inactive, Eclk 604 goes high to activate an evaluation cycle. Both node A 606 and node B 608 are pulled to low because both input A 606 and B 608 are high. During cycle 3, while Eclk 604 is inactive and Pclk 602 is active, node A 610 is precharged. Once node A 610 is precharged, node B 612 is subsequently precharged by intermediate node precharge circuit 318 of FIG. 3. Gate delay 630 may be introduced by intermediate node precharge circuit 318. Gate delay 630 may vary depending on the size of transistors used in latch circuit 336 and intermediate node precharge circuit 318.

During cycle 4, while both Pclk 602 and Eclk 604 are both inactive, no charge sharing occurs when input B 608 goes high because both node A 610 and node B 612 are precharged. Accordingly, intermediate node precharge circuit 318 prevents or substantially reduces the occurrence of charge sharing in a domino circuit using pulsed clock. Thus, preventing the occurrence of charge sharing can improve over all system performance and reliability.

Figure 7:
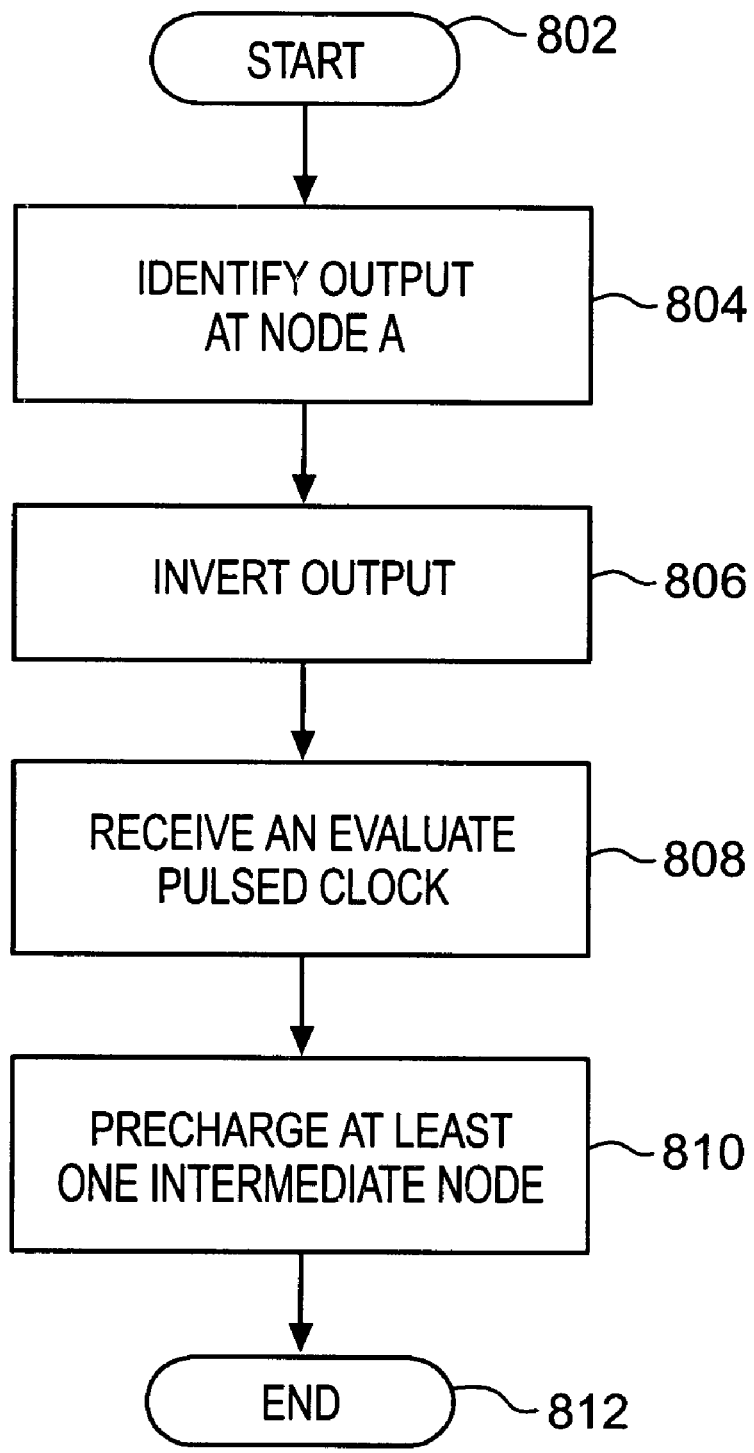
FIG. 7 is a flowchart illustrating an embodiment of a process for precharging intermediate nodes.

FIG. 7 is a flowchart 800 illustrating an embodiment of a process for precharging intermediate nodes. The process starts at block 802 and proceeds to block 804 where the process identifies the output value at node A. Upon identifying the output value, the process proceeds from block 804 to block 806 where the output value is inverted. After block 806, the process proceeds to block 808 where the process receives an evaluating pulsed clock. Upon identifying the inverted output value, the process proceeds from block 808 to block 810 where at least one intermediate node is precharged. After completion of the precharge, the process proceeds from block 810 to block 812 where the process ends.

Figure 8:
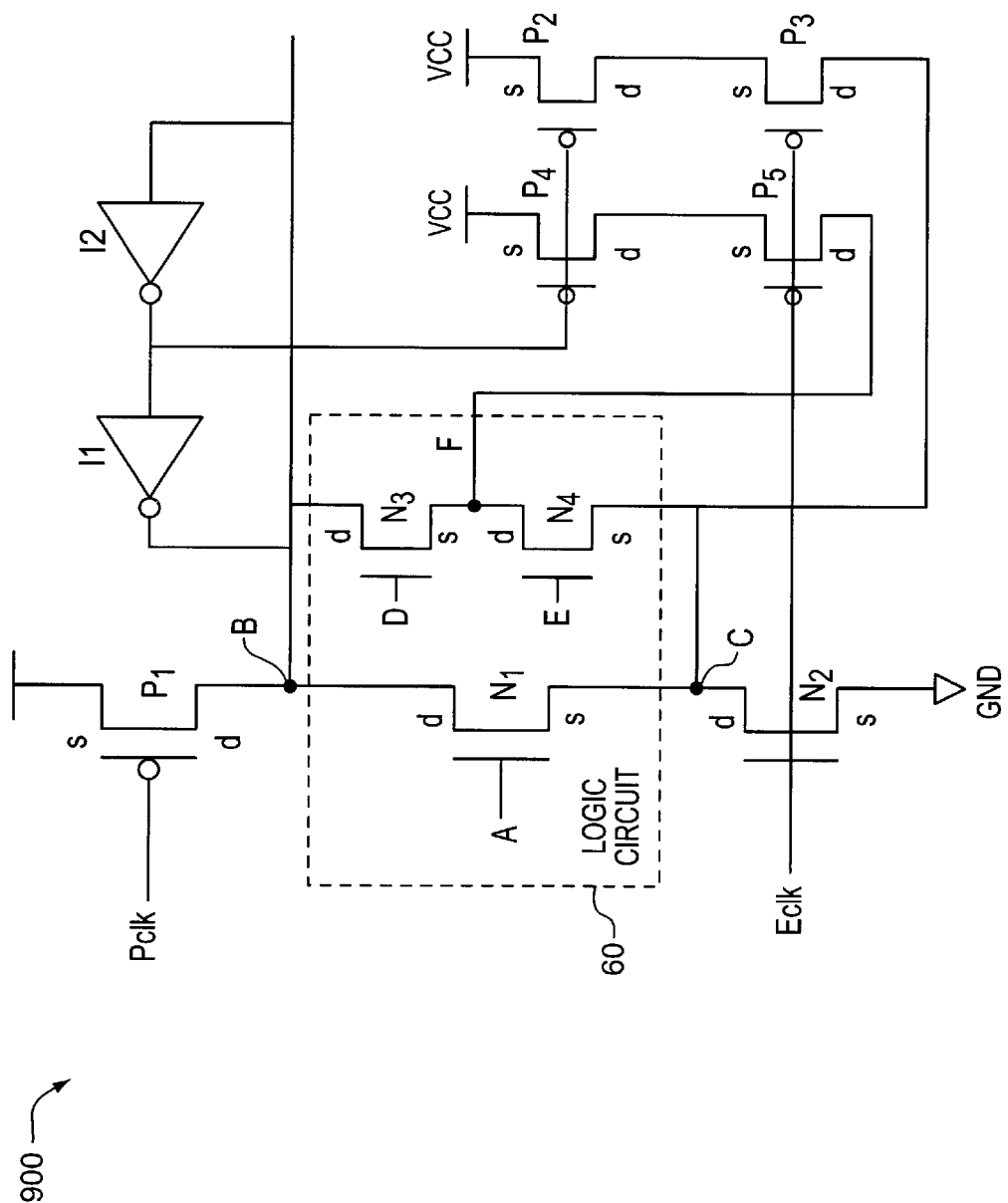
FIG. 8 is a diagram illustrating an embodiment of pulsed clock circuit according to an embodiment of the present invention.

FIG. 8 is a diagram of one embodiment of a pulsed clock circuit 900. Referring to FIG. 8, p-channel transistors P4 and P5 are coupled in parallel to transistors P2 and P3. Transistor P4 includes a gate terminal connected to the output of inverter I2, a source terminal connected to Vcc, and a drain terminal connected to the source of transistor P5. Transistor P5 also includes a gate terminal connected to eclk and a drain terminal connected to intermediate node F. Thus, transistors P2 and P3 set intermediate node C to a high and transistors P4 and P5 set intermediate node F to a high only if both node B is high and eclk is low, thereby preventing charge sharing between each of the intermediate nodes C and F, respectively, and the output node B. Thus, charge sharing may be reduced in a variety of pulsed clock circuits.

Figure 9:
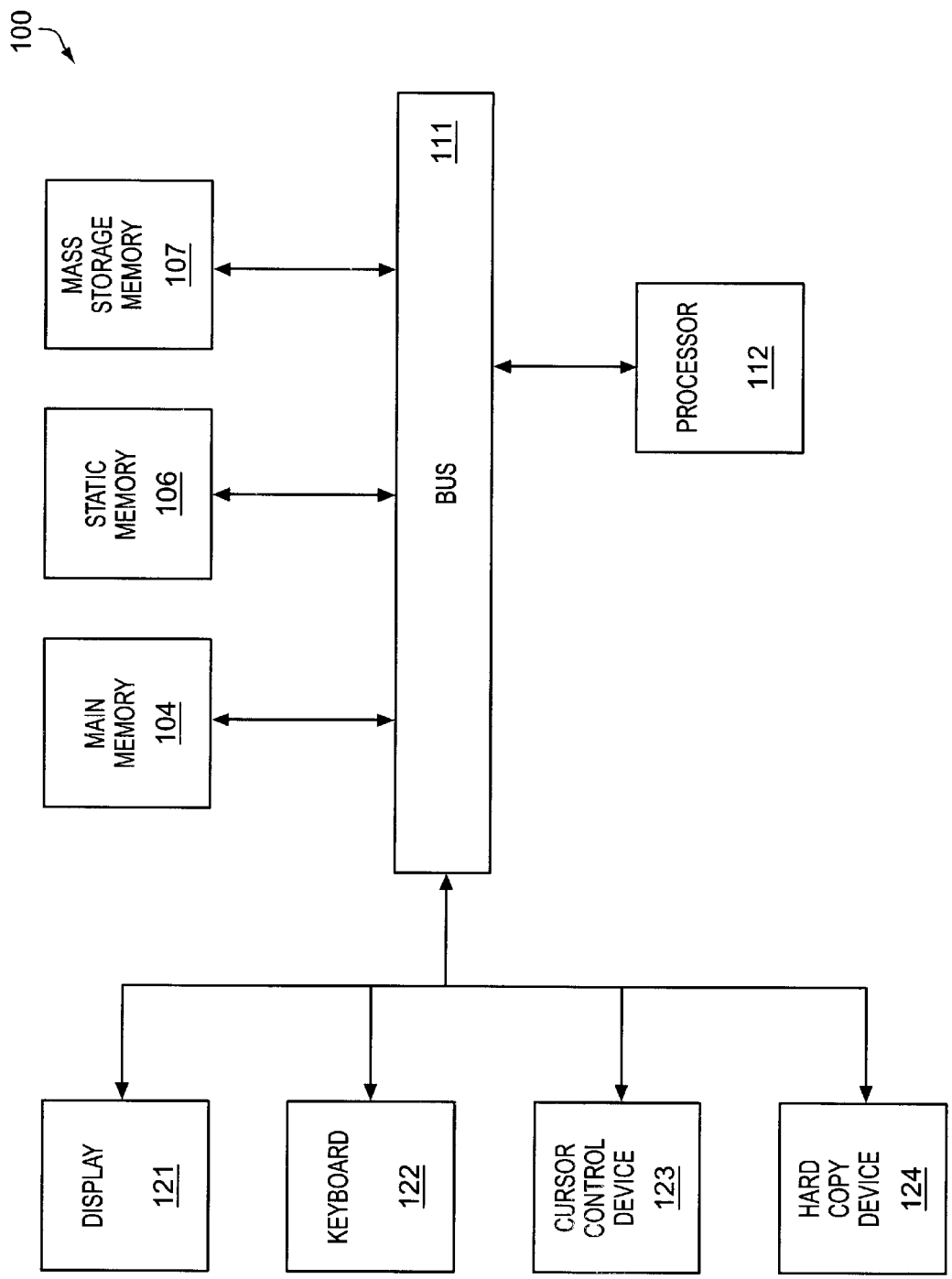
FIG. 9 is a block diagram of one embodiment of the computer system.

Referring to FIG. 9, the computer system into which an embodiment of the present invention is implemented is shown as 100. Computer system 100 comprises a bus or other communication means 111 for communicating information, and a processor 112 coupled with bus 111 for processing information. Processor 112 includes a microprocessor, such as for example, but not limited to, an Intel Architecture Microprocessor™, manufactured by Intel Corporation of Santa Clara, Calif., the corporate assignee of the present invention. Processor 112 may also be another processor such as for example, but not limited to the PowerPCT™, Alpha™, et cetera.

System 100 further comprises a random access memory (RAM), or other dynamic storage device 104 (referred to as main memory) coupled to bus 111 for storing information and instructions to be executed by processor 112. Main memory 104 also may be used for storing temporary variables or other intermediate information during execution of instructions by processor 112. Computer system 100 also comprises a read only memory (ROM) and/or other static storage device 106 coupled to bus 111 for storing static information and instructions for processor 112, and a data storage device 107, such as a magnetic disk or optical disk and its corresponding disk drive. Data storage device 107 is coupled to bus 111 for storing information and instructions.

Computer system 100 may further be coupled to a display device 121, such as a cathode ray tube (CRT) or liquid crystal display (LCD), coupled to bus 111 for displaying information to a computer user. An alphanumeric input device 122, including alphanumeric and other keys, may also be coupled to bus 111 for communicating information and command selections to processor 122. An additional user input device is cursor control 123, such as a mouse, trackball, trackpad, stylus, or cursor direction keys, coupled to bus 111 for communicating direction information and command selections to processor 112, and for controlling cursor movement on display 111.

Another device which may be coupled to bus 111 is hard copy device 124, which may be used for printing instructions, data, or other information on a medium such as paper, film, or similar types of media. Furthermore, a sound recording and playback device, such as a speaker and/or microphone may optionally be coupled to bus 111 for audio interfacing with computer system 100. However, it can be appreciated that other configurations of the computer system may include some or all of the devices Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims, which in themselves recited only those features regarded as essential to the invention.

Thus, a method and apparatus for reducing charge sharing in a domino circuit with pulsed clock has been described.

What is claimed is:

1. A circuit comprising:
   at least one input,
   an evaluate pulsed clock,
   and an output, the circuit to precharge an intermediate node in the circuit in response to a precharged pulsed clock and the evaluate pulsed clock when the evaluate pulsed clock is not in an evaluate cycle.

2. The circuit for claim 1, further comprising a latch coupled to the output, the latch to store the logic value of the output.

3. The circuit of claim 1, further comprising a precharge circuit coupled to the circuit, the precharge circuit receiving first and second precharge inputs and producing a precharge output.

4. The circuit of claim 3, wherein the first precharge input is the evaluate pulse clock.

5. The circuit of claim 3, wherein the second precharge input is an inverted output.

6. The circuit of claim 3, wherein the precharge output is coupled to the intermediate node.

7. The circuit of claim 3, wherein the precharge circuit includes two transistors.

8. The circuit of claim 7, wherein the transistors are p-type transistors.

9. The circuit of claim 7, wherein the transistors are n-type transistors.

10. The circuit of claim 7, wherein the transistors are an n-type transistor and a p-type transistor.

11. The circuit of claim 1, wherein the circuit is a domino circuit capable of receiving the precharge pulsed clock and the evaluate pulsed clock.

12. A method for reducing charge sharing in a circuit comprising:
    charging an output node of the circuit in response to a precharge pulsed clock; and
    charging at least one intermediate node of the circuit in response to an evaluate pulsed clock when the evaluate pulsed clock is not in an evaluate cycle.

13. The method of claim 12, further comprising charging the intermediate node in response to the output node of the circuit.

14. The method of claim 12, wherein the charging at least one
    intermediate node further includes:
    receiving the evaluate pulsed clock;
    inverting the logic value of the output of the circuit; and
    charging at least one of the intermediate node in response to the evaluate pulsed clock when the evaluate pulsed clock is not in an evaluate cycle and the inverted logic value of the output.

15. The method of claim 12, wherein the circuit includes performing an NAND gate logic function.

16. The method of claim 12, wherein the circuit includes performing a NOR gate logic function.

17. The method of claim 12, wherein the circuit includes performing an inverting logic function.

18. A device of precharging a logic circuit comprising:
    means for latching an output of the logic circuit; and
    means for precharging at least one intermediate node within the logic circuit in response to an evaluate pulsed clock when the evaluate pulsed clock is not in an evaluate cycle.

19. The device of claim 18, further comprising means for precharging the intermediate node in response to the output of the circuit.

20. The device of claim 18, wherein the precharging further includes:
    means for receiving the evaluate pulsed clock;
    means for inverting logic value of the output of the circuit; and
    means for charging at least one of the intermediate node in response to the evaluate pulsed clock and the output.

21. The device of claim 18, wherein the logic circuit includes means for performing a NAND logic function.

22. The device of claim 18, wherein the logic circuit includes means for performing a NOR logic function.

23. A domino circuit comprising:
    a precharge circuit to precharge output nodes;
    a logic circuit coupled to the precharge circuit to perform at least one logic function, the logic circuit having at least one output node and one intermediate node; and
    an intermediate node precharge circuit coupled to the logic circuit to precharge the intermediate node in response to a pulsed clock and an evaluate pulsed clock when the evaluate pulsed clock is not in an evaluate cycle.

24. The domino circuit of claim 23, wherein the intermediate node precharge circuit further receives a logic value of inverted output.

25. The domino circuit of claim 23, wherein the pulsed clock is an evalutation pulsed clock.

26. The domino circuit of claim 23, wherein the precharge circuit receives a precharge pulsed clock for precharging.

27. A circuit for reducing charge sharing comprising:
    a first node and a second node connected to a logic circuit, the logic circuit to receive one or more data inputs;
    a first transistor having source, drain and gate terminals, the source terminal of the first transistor coupled to a first power supply voltage, the drain terminal of the first transistor coupled to the second node, the gate terminal of the first transistor to receive a first pulsed clock signal;
    a second transistor having one source, drain and gate terminals, the source terminal of the second transistor coupled to a second power supply voltage, the drain terminal of the second transistor coupled to the first node, and the gate terminal of the second transistor receiving a second pulsed clock signal; and a third transistor and a fourth transistor coupled to each other, one of the third and fourth transistors coupled to the second node to prevent charge sharing between the first and second nodes.

28. A circuit for reducing charge sharing comprising:

a first node and a second node each connected to a logic circuit, the logic circuit to receive one or more data inputs;

a first transistor having source, drain and gate terminals, the source terminal of the first transistor coupled to a first power supply voltage, the drain terminal of the first transistor coupled to the second node, the gate terminal of the first transistor to receive a first pulsed clock signal;

a second transistor having source, drain and gate terminals, the source terminal of the second transistor coupled to a second power supply voltage, the drain terminal of the second transistor coupled to the first node, and the gate terminal of the second transistor to receive a second pulsed clock signal;

a third transistor having source, drain and gate terminals, the drain terminal of the third transistor coupled to the second node, and the gate terminal of the second transistor coupled to the first pulsed clock signal;

a fourth transistor having source, drain and gate terminals, the drain terminal of the fourth transistor coupled to the source terminal of the third transistor, and the source terminal of the fourth transistor coupled to the second power supply voltage; and an inverter having an input coupled to the first node and an output coupled to the gate terminal of the fourth transistor.

29. The circuit of claim 28 wherein the first power supply voltage is Ground.

30. The circuit of claim 28 wherein the second power supply voltage is Vcc.

31. The circuit of claim 28 wherein the first pulsed clock signal is a pulsed evaluate clock signal which causes the data input to the logic circuit to be evaluated when the pulsed evaluate clock signal is active.

32. The circuit of claim 28 wherein the first pulsed clock signal is a pulsed precharge clock signal which causes the first node to be precharged when the pulsed precharge clock signal is active.

33. A circuit for reducing charge sharing comprising:

a logic circuit to receive one or more data inputs, the logic circuit coupled between a first node and a second node;

an n-channel transistor having source, drain and gate terminals, the source terminal of the n-channel transistor coupled to a first power supply voltage, the drain terminal of the n-channel transistor coupled to the second node, the gate terminal of the n-channel transistor to receive a first pulsed clock signal;

a first p-channel transistor having source, drain and gate terminals, the source terminal of the first p-channel transistor coupled to a second power supply voltage, the drain terminal of the first p-channel transistor coupled to the first node and the gate terminal of the first p-channel transistor to receive a second pulsed clock signal;

a second p-channel transistor having source, drain and gate terminals, the drain terminal of the second p-channel transistor coupled to the second node, and the gate terminal of the first p-channel transistor coupled to the first pulsed clock signal;

a third p-channel transistor having source, drain and gate terminals, the drain of the third p-channel transistor coupled to the source of the second p-channel transistor, and the source of the third p-channel transistor coupled to the second power supply voltage; and and inverter having an input coupled to the first node and an output coupled to the gate terminal of the third p-channel transistor.

34. The circuit of claim 33 wherein the logic circuit comprises an inverter.

35. The circuit of claim 33 wherein the logic circuit comprises a NAND gate.

36. The circuit of claim 33 wherein the first power supply voltage is Ground.

37. The circuit of claim 33 wherein the second power supply voltage is Vcc.

38. The circuit of claim 33 wherein the first node is an output terminal of the circuit.

39. The circuit of claim 33 wherein the first pulsed clock signal is a pulsed evaluate clock signal and the second pulsed clock signal is a pulsed precharge clock signal.

40. The circuit of claim 33 wherein the first pulsed clock signal is a pulsed evaluate clock signal which causes the data input to the logic circuit to be evaluated when the pulsed evaluate clock signal is active.

41. The circuit of claim 33 wherein the first pulsed clock signal is a pulsed evaluate clock signal which causes the data input to the logic circuit to be evaluated when the pulsed evaluate clock signal is active, one cycle of the pulsed evaluate clock signal including a first phase and a second phase, the pulsed evaluate clock signal being active only during a portion of the first phase of its cycle.

42. The circuit of claim 41 wherein the first phase of the pulsed evaluate clock signal includes first and second portions, the pulsed evaluate clock signal being active only during the first portion of one of its first phase.

43. The circuit of claim 33 wherein the second pulsed clock signal is a pulsed precharge clock signal to cause the first node to be precharged when the pulsed precharge clock signal is active.

44. The circuit of claim 33 wherein the second pulsed clock signal is a pulsed precharge clock signal, a cycle of the pulsed precharge clock signal including a first phase and a second phase, the pulsed precharge clock signal being active only during a portion of the second phase of its cycle.

45. A circuit comprising:

an output node;

one or input nodes to receive inputs; and a precharge circuit to precharge an intermediate node other than the output node in response to a pulsed evaluate clock when the evaluate pulsed clock is not in an evaluate cycle to prevent charge-sharing between the output node and the intermediate node when the inputs received are in an unfavorable state.

46. The circuit of claim 45, wherein the intermediate node is precharged during a first state of the pulsed evaluate clock and the circuit is evaluated during a second state different from the first state of the pulsed evaluate clock.

* * * * *

UNITED STATES PATENT AND TRADEMARK OFFICE
CERTIFICATE OF CORRECTION

PATENT NO.   : 6,377,078 B1
DATED        : April 23, 2002
INVENTOR(S)  : Madland It is certified that error appears in the above-identified patent and that said Letters Patent is hereby corrected as shown below:

Column 4,
Line 29, after "logic", delete "is", insert -- 1s --.

Signed and Sealed this

Fifth Day of November, 2002

Attest:

Attesting Officer

JAMES E. ROGAN
Director of the United States Patent and Trademark Office